(12) United States Patent
Schulz-Harder et al.

(10) Patent No.: US 7,940,526 B2
(45) Date of Patent: May 10, 2011

(54) ELECTRICAL MODULE

(75) Inventors: Jurgen Schulz-Harder, Lauf (DE); Andreas Meyer, Wenzenbach (DE)

(73) Assignee: Curamik Electronics GmbH, Eschenbach (DE)

( * ) Notice: Subject to any disclaimer, the term of this patent is extended or adjusted under 35 U.S.C. 154(b) by 0 days.

(21) Appl. No.: 11/992,986

(22) PCT Filed: Jul. 26, 2006

(86) PCT No.: PCT/DE2006/001284
§ 371 (c)(1), (2), (4) Date: Apr. 13, 2009

(87) PCT Pub. No.: WO2007/041977
PCT Pub. Date: Apr. 19, 2007

(65) Prior Publication Data
US 2009/0213547 A1   Aug. 27, 2009

(30) Foreign Application Priority Data
Oct. 7, 2005   (DE) .......................... 10 2005 048 492

(51) Int. Cl.
*H05K 7/20* (2006.01)
(52) U.S. Cl. .................. 361/699; 361/679.53; 361/702; 361/704; 165/104.33; 165/185; 363/141
(58) Field of Classification Search .................. 361/699, 361/702, 704, 707, 715–716, 719, 679.53; 165/80.4, 104.33, 185; 363/141
See application file for complete search history.

(56) References Cited

U.S. PATENT DOCUMENTS

| | | | |
|---|---|---|---|
| 4,578,745 A | | 3/1986 | Olsson |
| 6,014,312 A | * | 1/2000 | Schulz-Harder et al. ..... 361/699 |
| 6,084,771 A | * | 7/2000 | Ranchy et al. ................ 361/699 |
| 6,345,665 B1 | * | 2/2002 | Schulz-Harder ............. 165/80.4 |
| 6,386,278 B1 | * | 5/2002 | Schulz-Harder .............. 165/167 |
| 6,877,869 B2 | * | 4/2005 | Exel et al. ..................... 359/845 |
| 7,200,007 B2 | * | 4/2007 | Yasui et al. ................... 361/716 |
| 7,245,493 B2 | * | 7/2007 | Inagaki et al. ................ 361/699 |
| 7,508,668 B2 | * | 3/2009 | Harada et al. ................ 361/699 |
| 7,571,759 B2 | * | 8/2009 | Inagaki et al. ............... 165/80.4 |
| 7,724,523 B2 | * | 5/2010 | Ishiyama ...................... 361/699 |
| 7,826,226 B2 | * | 11/2010 | Ishiyama ..................... 361/699 |
| 2005/0133210 A1 | * | 6/2005 | Inagaki et al. ................ 165/152 |
| 2006/0243422 A1 | * | 11/2006 | Sakai et al. .................. 165/80.4 |
| 2007/0044952 A1 | * | 3/2007 | Kuno et al. ................... 165/287 |
| 2009/0008061 A1 | * | 1/2009 | Inagaki et al. ............... 165/80.4 |

FOREIGN PATENT DOCUMENTS

| | | |
|---|---|---|
| EP | 0 886 315 | 12/1998 |
| EP | 0 978 874 | 2/2000 |
| WO | WO 2005020276 A2 * | 3/2005 |
| WO | WO 2005/067039 | 7/2005 |

* cited by examiner

*Primary Examiner* — Robert J Hoffberg
(74) *Attorney, Agent, or Firm* — Welsh Flaxman & Gitler LLC

(57) ABSTRACT

The invention relates to a module with a number of electrical or electronic components or switching circuits provided on a common cooler structure flowed through by a cooling medium. The entire cooler structure is made up of at least two plate-shaped coolers, which are arranged parallel to one another in an interspaced manner and which are flowed through by the cooling medium.

23 Claims, 4 Drawing Sheets

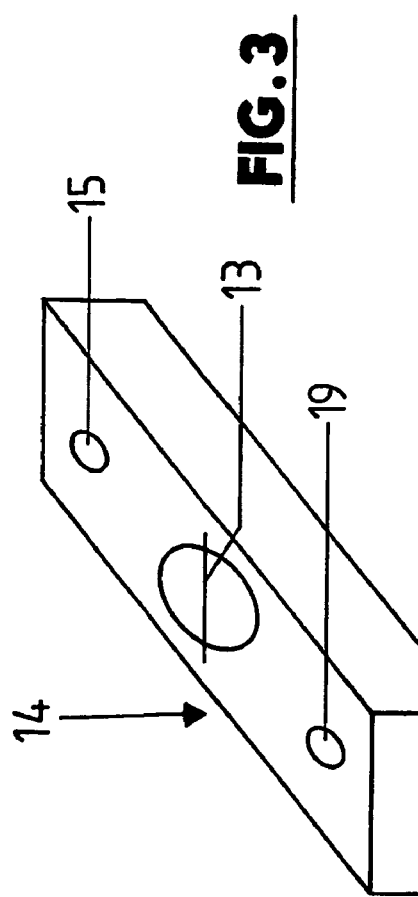
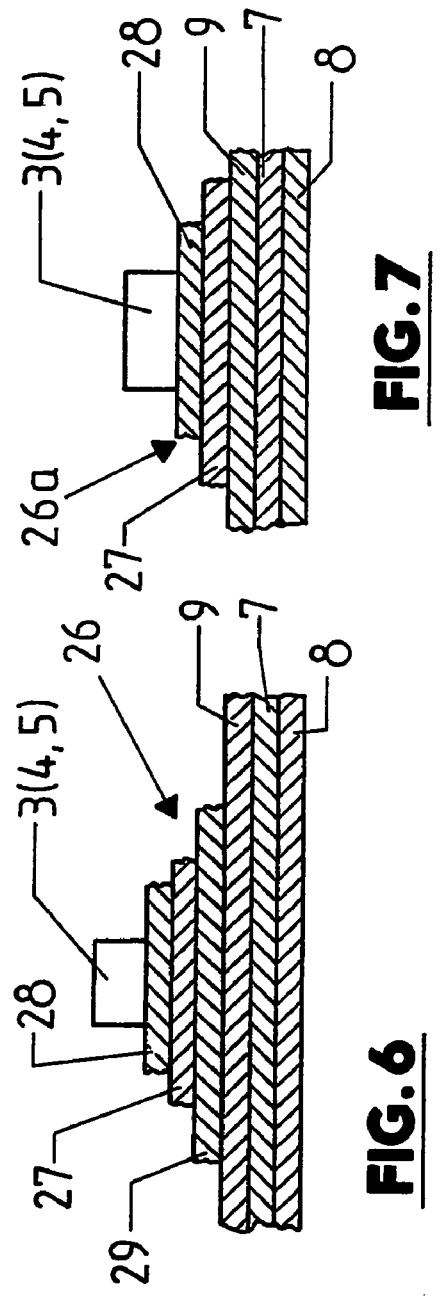

ELECTRICAL MODULE

BACKGROUND OF THE INVENTION

The invention relates to an electric or electronic module with several electric or electronic components or circuits provided on a common cooler structure perfused by a coolant.

It is an object of the invention is to present a module which can be achieved in a very compact design by means of a simplified manufacturing process.

SUMMARY OF THE INVENTION

In a preferred embodiment, the electric module is designed so that the common cooler structure consists of at least two plate-shaped coolers perfused by the coolant and arranged parallel to each other and at a distance from each other, that at least one circuit on a cooler is provided in a space between two adjacent coolers, that each cooler consists of several interconnected layers of sheet or roll metal, that inner layers of each cooler are structured by openings made in said layers resulting in an inner structured cooling area, which forms a flow channel for the coolant that constantly branches off in all three spatial axes, and that the interconnected layers form continuous posts in the structured area, the posts extend to the top and bottom side or to the top and bottom side of the respective cooler.

One of the advantages of this embodiment is that this special design of the cooler (consisting of several interconnected layers of metal foil with a constantly branching flow channel formed by the structuring of the inner layers) achieves high cooling power with the coolant perfusing the cooler. The posts that are formed by the structuring of the inner layers and that extend between the top and bottom of the respective cooler also achieve high stability of the individual coolers, in particular so that the latter do not expand with the pressure of the coolant. This prevents the risk of unwanted contact or electrical contact so that the high cooling capacity and the high stability of the cooler enable a very compact design of the module with densely arranged coolers.

BRIEF DESCRIPTION OF THE DRAWINGS

The invention is explained below in more detail based on exemplary embodiments with reference to the drawings, wherein:

FIG. 3 is a perspective view of a spacer for use in the module of FIG. 1;

FIGS. 6 & 7 are partial views of consecutive layers in the area of a circuit in various embodiments;

DETAILED DESCRIPTION OF THE INVENTION

Figure 1:
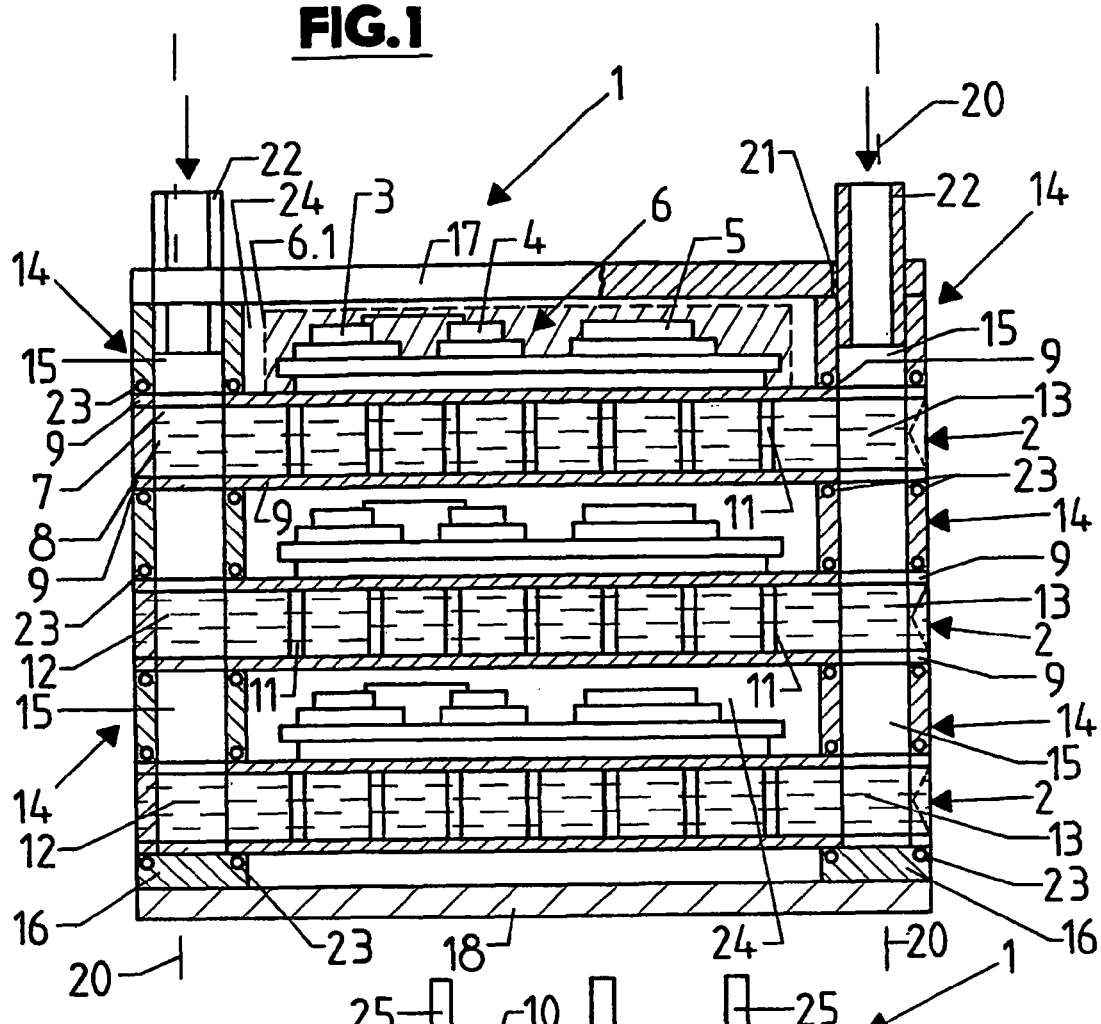
FIG. 1 is a simplified representation in cross section of an actively cooled module according to the invention.

In the drawings, 1 is an electric or electronic module, which consists of several—in the depicted embodiment a total of three—plate-shaped coolers 2 arranged parallel to each other and at a distance from each other, each of which in the depicted embodiment is provided on the top side with an electronic circuit 6 comprising several electric components, for example components 3, 4 and 5.

At least one of these components, for example the component 5, is a power component, for example an electric resistor, a diode, a transistor, an IGB, a thyristor, triac, etc., which generates a considerable power loss during operation and for this reason must be cooled with the corresponding cooler 2. In the practical embodiment, the components 3-5 of each circuit 6 are accommodated in a closed housing 6.1, i.e. injection molded with plastic, for example.

Figure 4:
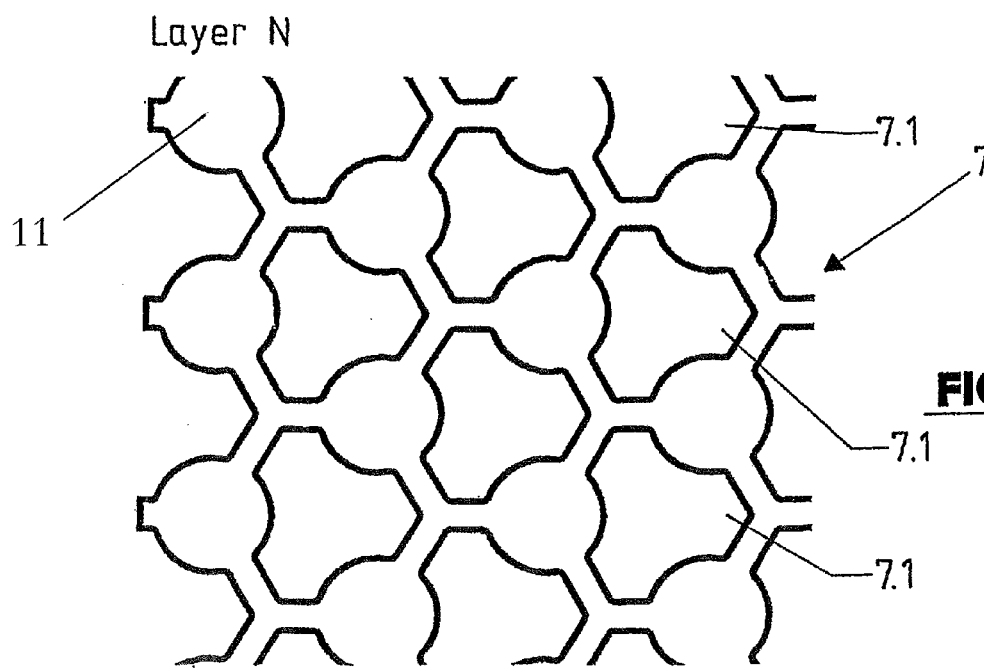
FIGS. 4 & 5 are partial views of two inner layers of a cooler for use in the module of FIGS. 1 and 2.
Figure 5:
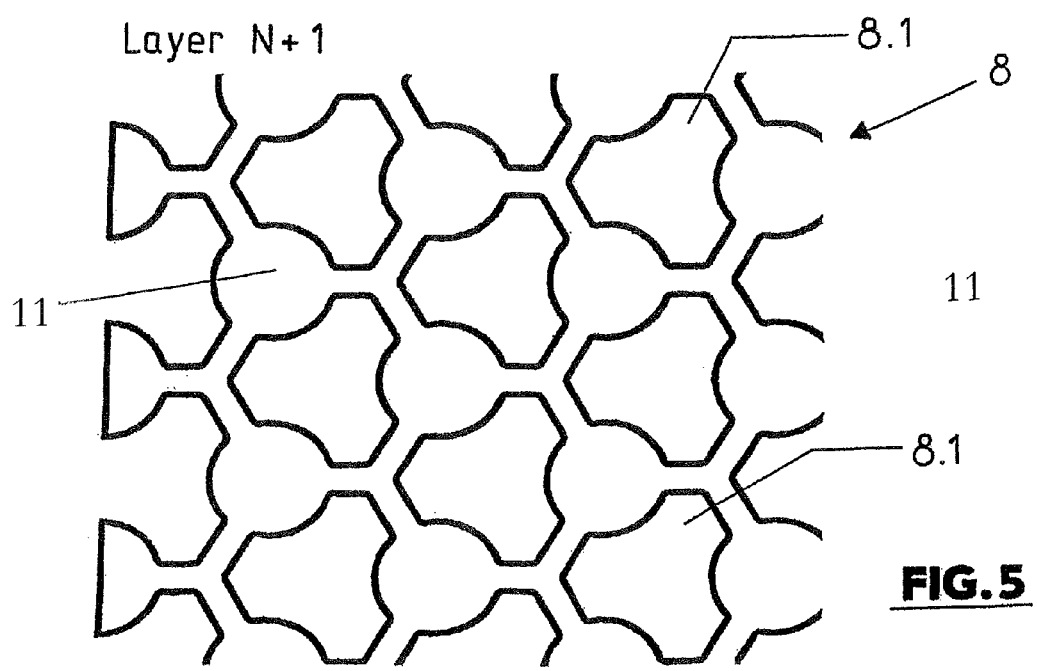

Each cooler 2 is manufactured of thin metal layers or sheets made of a suitable, thermally conductive material, for example of copper, namely of inner layers 7 and 8 and of outer layers 9. The inner layers 7 and 8 are structured or provided with a plurality of openings in the manner depicted in FIGS. 3 and 4, so that this structuring of the openings 7.1 and 8.1, corresponding to the dashed line 10 in FIG. 2, produces an inner cooler structure with a constantly branching flow channel in all three spatial axes for the coolant perfusing the cooler 2. Further, the structuring is executed so that the successive, interconnected layers 7 and 8 form continuous posts 11, which extend to the outer layers 9 and are connected with the latter. The posts 11 achieve increased stability of the respective cooler 2, in particular also against expanding when the cooler 2 is perfused with a pressurized coolant. Further, the posts 11 serve as thermal conductors for dissipating heat from the top of the cooler 2 comprising the respective circuit 6, also in such areas of the inner cooler structure 10 that are remote from said top side, therefore significantly improving the effectiveness of the respective cooler 2. Further, the posts 11 perfused by the coolant also significantly increase the effective inner cooling area.

The embodiment of the cooler 2 described above results in a cooling surface formed by the inner cooler structure 10 that is significantly larger than the surface occupied by the respective circuit 6 on the outer or top surface of the respective cooler. The inner cooling surface is larger by a factor of at least three than the outer surface of the cooler 2 on its top or bottom side, in any case larger by a factor of three than the outer cooler surface occupied by the circuit 6.

The top and bottom side of each cooler 2 is formed by a layer 9, respectively, which seals the inner cooler structure 10 on the respective side of the cooler 2 toward the outside. The structuring of the layers 7 and 8 is designed so that the screen-like area formed by the openings 7.1 and 8.1 is surrounded by a closed edge, so that the structured area 10 formed by the openings 7.1 and 8.1 and perfused by the coolant is also sealed on the periphery of each cooler 2.

In the depicted embodiment the layers 7-9 each have a rectangular shape, so that the coolers 2 are also rectangular in top view. In the area of the two narrow sides each cooler 2 is provided with a continuous bore hole 12 and 13, respectively, which extends from the top to the bottom of the respective cooler 2 and serves to supply the coolant (hole 12) and remove the coolant (hole 13). The holes 12 and 13, which are produced for example by corresponding structuring of the layers 7-9 or by machining of the cooler 2 after bonding of the layers 7-9, each lead into the structured area 10.

As shown in FIG. 1, the individual coolers 2 are kept at a distance from each other by spacers 14, which are provided on the narrow sides of the coolers 2. The spacers 14 are cube-shaped as shown in FIG. 3 and lie with their longitudinal extension parallel to and also flush with the respective narrow side. Each spacer has a bore hole 15, which in the mounted state of the module 1 is congruent with a bore hole 12 or 13, so that the holes 15 and 12 or 15 and 13, respectively, lead to a channel for supplying or removing the coolant. On the lower coolers 2 in FIG. 1, an end element 16 is provided in the area of each narrow side, which (end element) corresponds in design and shape for example to a spacer 14 without a bore hole 15, but preferably with a reduced thickness as compared with the spacers 14.

To hold together the structure consisting of the coolers 2, the spacers 14 and the end elements 16 in the depicted embodiment, a top and a bottom holding or clamping plate 17 and 18 are provided, which are oriented with the surface sides parallel to the top side of the coolers 2.

The top clamping plate 17 is kept at a distance from the adjacent top cooler 2 by means of two spacers 14. The lower holding plate 18 bears with a surface side facing the coolers 2 against the two end elements 16. Several clamping screws or bolts not depicted, which are provided in congruent openings 19 in the coolers 2, the spacers 14, the end elements 16 and the clamping plates 17 and 18, clamp the elements forming the module 1 together, as indicated by the dashed line 20. In the upper clamping plate 17, openings 21 are provided through which connecting tubes or connecting elements 22 are guided outward, by means of which the module 1 can then be connected with lines, not depicted, for supplying and removing the coolant. The connecting elements 22, which are tubular in the depicted embodiment, are held with an end in a bore hole 15 of the spacers 14 provided between the clamping plate 17 and the adjacent cooler 2, namely for example by being screwed into an internal thread of the corresponding bore hole 15.

For a sealed transition between the coolers 2 and the spacers 14 and the end elements 16, seals, e.g. ring seals 23, are provided. For exact positioning of these seals, the spacers 14 are provided for example with recesses enclosing openings of the bore holes 15 for partially holding each seal 23. The end elements 16 also have corresponding recesses. The spacers 14 and the end elements 15 are manufactured for example from an electrically insulating material, for example as plastic molded or injection molded parts.

Figure 2:
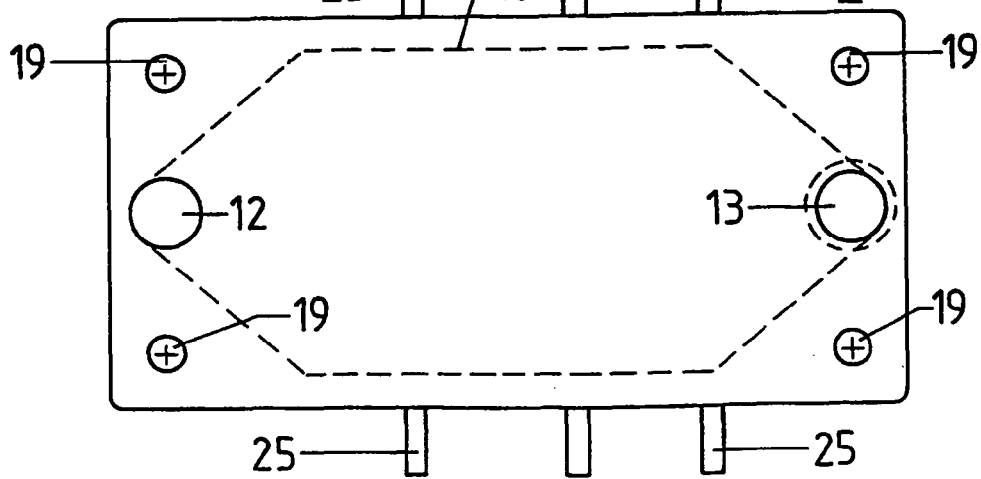
FIG. 2 is a top view of the module of FIG. 1.

The thickness of the spacers 14 and therefore the distance between the adjacent coolers 2 is selected on the one hand so as to produce a compact design for the module 1 and on the other hand so that the space 24 between two coolers 2 or between the top clamping plate 17 and the adjacent cooler 2 is sufficient for the respective circuit 6, which is provided between the two narrow sides of the cooler 2 and therefore between two spacers 14 on the cooler. The connections 25 (voltage connections, control connections, etc.) in the depicted embodiment are guided outward on the longitudinal sides of the cooler 2 and therefore on the longitudinal sides of the module 1, as depicted in FIG. 2. This enables an especially easy connection with external connecting elements or lines. Preferably the connections 25 are then provided in a defined array, to enable connection of the entire module 1 and its connections 25 by plugging it into external multiple-terminal strips.

As shown in FIG. 7, the circuits 6 are each manufactured using a substrate 26, which comprises for example an insulating layer, i.e. in the depicted embodiment a ceramic layer 27, which is metallized on both surfaces, i.e. in the depicted embodiment is provided with a copper layer 28 and 29. Of these copper layers, which for example are provided on the ceramic layer 27 (e.g. $Al_2O_3$ ceramic) by means of known DCB (Direct Copper Bonding) technology, the copper layer 28 is correspondingly structured to form strip conductors, connections and contact or mounting surfaces for the components 3-5, etc. The copper layer 29 is bonded two-dimensionally in a suitable manner with the top side of the respective cooler 2, for example by gluing using a thermally conductive adhesive, by soldering (also active soldering) or by direct bonding (DCB) or active soldering; if the substrate 26 is manufactured by direct bonding (DCB), said substrate is already manufactured during the manufacture of the cooler.

Therefore, two basic possibilities exist for the manufacture of the coolers provided with the circuits 6, namely in the form that the circuits 6 and the coolers 2 are manufactured in separate processes and then bonded, the circuits 6 by first manufacturing the substrates 26, structuring the copper layer 26 and then mounting the components 3-5 and finally injection molding with plastic to form the respective housing 6.1. The substrates manufactured in this manner are then mounted on the respective pre-fabricated coolers 2. The advantage of this manufacturing method is that the substrates 26 can be manufactured, structured and mounted in multiple printed panels.

The other basic method is to manufacture the substrate 26 together with the respective cooler 2 and then to structure the copper layer 28 to form strip conductors, contact surfaces, etc. Afterwards, the components 3-5 are mounted and the plastic is injection molded to form the respective housing 6.1.

All methods have in common that the coolers 2 are assembled to form the module 1 only after being provided with the circuits 6, in order to enable the desired compact design by means of a simplified manufacturing process.

FIG. 7 shows in a depiction similar to FIG. 6 the layer structure in the area of a circuit 6. The substrate 26a used for this structure differs from the substrate 26 in that the ceramic layer 27 is applied directly to the top surface of the respective cooler 2, namely using a suitable bonding technology, e.g. direct bonding or active soldering.

Figure 8:
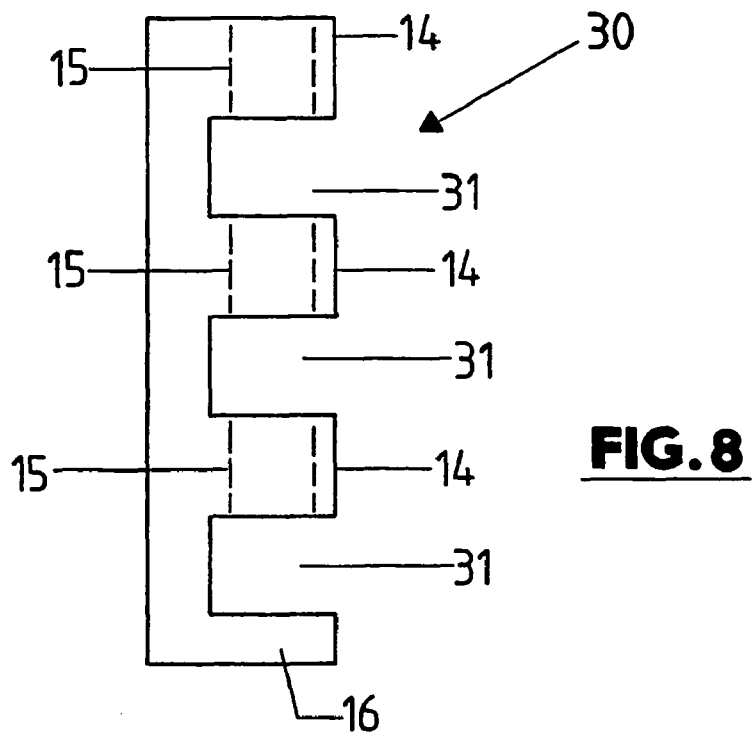
FIG. 8 is a partial view of a spacer and connecting element for use in a module according to the invention.

FIG. 8 shows in a simplified depiction a spacer and connecting element 30, which is manufactured for example as a molded plastic part, so that with its comb-like structure it forms the spacers 15 and the end element 16 for a narrow side of the module 1, respectively. Combining the spacers 14 and the end element 16 to form a single component considerably simplifies the mounting of the module, i.e. after insertion of the seal rings 23, the coolers 2 provided with the circuits 6 are inserted respectively into the recesses 31 formed by the comb-like structure and then clamped by means of the clamping bolts 20 with each other and also with the holding and clamping plates 17 and 18.

As shown in FIG. 1, the coolant is supplied and removed via the connecting elements 22 at the top of the module, i.e. at the top clamping plate 17. To achieve the best possible distribution of the coolant to all coolers 2 and therefore even cooling of the circuits 6, the structuring 10 of each cooler 2 is designed at least in the area of the opening 12, but preferably also in the area of the opening 13, so that the effective cross section of flow at the transition between the bore hole 12 or 13 and the structured area 10 is smaller than the cross section of said bore holes or of the channels formed by the bore holes 12, 13 and 15.

To improve the evenness of the perfusion of all coolers 2, it can be effective to provide a connecting element 22, for example for the supply of the coolant on the top side of the module and the other connecting element 22, for example for removing the coolant on the bottom side of the module, i.e. in the area of the clamping plate 18 located there, in order to achieve a diagonal perfusion of the module 1.

Figure 9:
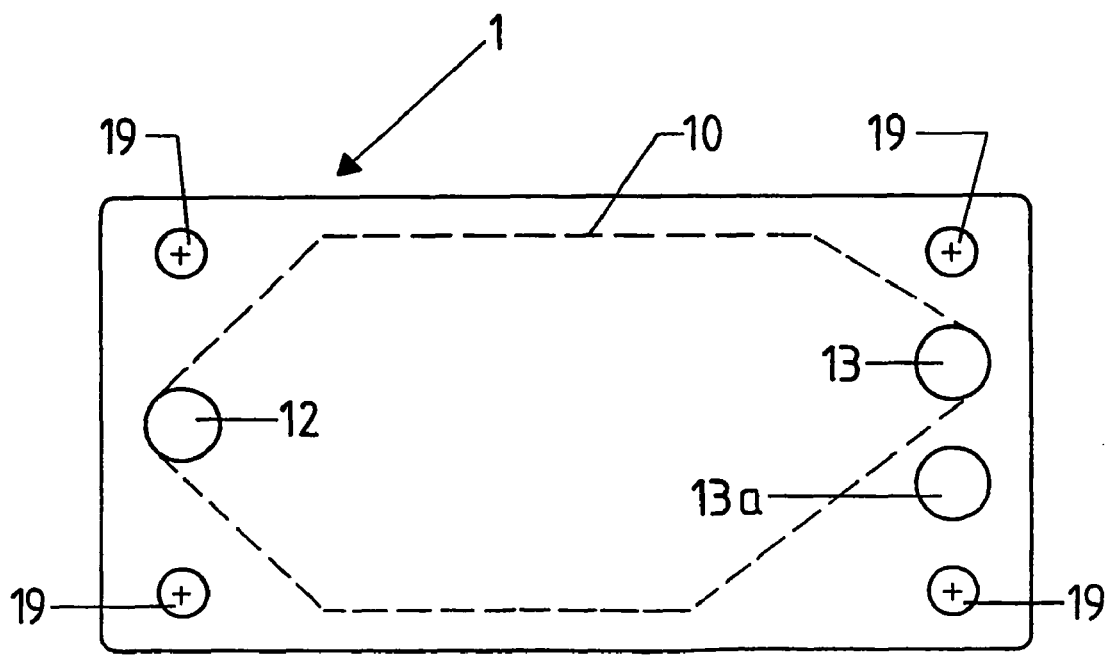
FIG. 9 is a view similar to FIG. 2 of a further possible embodiment.

As indicated in FIG. 9, it is further possible to form a further channel in addition to one of the channels created using the bore holes 12 or 13 and 15. This further channel is formed by an additional bore hole 13a in the coolers 2 and congruent bore holes in the spacers 14 and the respective narrow side of the module 1. Further, the lower end element 16 on this side of the module 1 is designed so that it connects the bore hole 13 there with the bore hole 13a and the upper spacer 14 on this narrow side is designed so that it closes the bore hole 13. The bore holes 13a are outside of the structured area 10 of the coolers 2. Due to the additional channel formed by the bore holes 13a and the corresponding bore holes in the spacers 14, despite the optimum diagonal perfusion of the cooler array for the even distribution of the coolant, it is possible to provide the connections for supplying and removing the coolant on a common side, e.g. on the top side of the module.

The individual coolers 2 are preferably designed so that they have a cooling capacity of at least 25 W/cm$^2$, namely relative to the surface occupied by the respective substrate 6, i.e. the coolers 2 can be used to cool components or circuits 6 that generate a power loss of at least 25 W/cm$^2$ on their surface that is connected with the cooler 2.

The invention was described above based on exemplary embodiments. It goes without saying that numerous modifications and variations are possible without abandoning the underlying inventive idea upon which the invention is based. For example, it is possible to provide one or more coolers 2 also with one or more circuits 6 on their bottom side facing away from the clamping plate 17.

REFERENCE LIST 1 module
2 cooler
3, 4, 5 components
6.1 housing
6 circuit
7, 8, 9 layer
7.1, 8.1 opening
10 structuring
11 post
12, 13, 13a bore hole
14 spacer
15 bore hole
16 end element
17, 18 holding or clamping plate
19 opening
20 clamping bolt
21 opening
22 connecting element
23 seal ring
24 intermediate space
25 connection
26, 26a substrate
27 ceramic layer
28, 29 copper layer
30 spacer and connecting element
31 intermediate space

What is claimed is:

1. An electric module with at least one electric circuit provided on a common cooler structure perfused by a coolant, comprising:
at least two plate-shaped coolers forming the common cooler structure and perfused by the coolant and arranged parallel to each other and at a distance from each other by spacers provided between the at least two plate-shaped coolers;
at least one first channel for supplying and distributing the coolant to the at least two plate-shaped coolers, the at least one first channel extending through at least part of the spacers;
at least one second channel for removing the coolant from the at least two plate-shaped coolers, the at least one second channel extending through at least part of the spacers;
the at least one electric circuit with electronic components being held in a space between two adjacent coolers of the at least two plate-shaped coolers and on one of the adjacent coolers of the at least two plate-shaped coolers; and
each of the at least two plate-shaped coolers comprising several interconnected layers made of a metal, wherein inner layers of the several interconnected layers of each of the at least two plate-shaped coolers are structured by openings made in said inner layers, the openings form an inner, structured cooling area, which forms a cooling channel for the coolant that branches off in three spatial axes; wherein the several interconnected inner layers form continuous posts in the structured cooling area, the continuous posts extend to a top and a bottom of a respective cooler;
wherein the at least one electric circuit comprises a substrate bonded to one of the at least two plate-shaped coolers with the electric components to the substrate on a side opposite the one of the at least two plate-shaped coolers;
wherein the substrate comprises an insulating layer with at least one-sided metallization that carries the electric components; and
wherein the at least one electric circuit and the electric components are spaced a distance from and not in contact with another one of the two adjacent coolers of the at least two plate-shaped coolers forming the common cooler structure.

2. The electric module according to claim 1, wherein the at least two plate-shaped coolers of the common cooler structure comprises on two opposing sides, respectively, at least two different electric circuits to be cooled.

3. The electric module according to claim 1, wherein a thickness of the at least two plate-shaped coolers is less than the width and length.

4. The electric module according to claim 1, further comprising connections for connecting the electric module to a coolant circuit.

5. The electric module according to claim 4, wherein the connections are provided on a common side of the module.

6. The electric module according to claim 1, wherein the spacers are made of an electrically insulating material.

7. The electric module according to claim 1, wherein the spacers are cube-shaped or plate-shaped.

8. The electric module according to claim 1, wherein the at least one first channel or the at least one second channel is embodied partially in the spacers.

9. The electric module according to claim 1, wherein the spacers are individual elements.

10. The electric module according to claim 1, wherein the spacers are formed at least partially by a common spacer element.

11. The electric module according to claim 1, wherein several spacers of the spacers are provided, respectively, on two opposing sides of the electric module, and that the spacers on each side of the module are formed by at least one spacer element.

12. The electric module according to claim 1, wherein the at least one electric circuit is provided between the at least one first channel and the at least one second channel.

13. The electric module according claim 1, wherein the at least one electric circuit is provided between two spacers of the spacers.

14. The electric module according to claim 1, wherein electric connecting elements for connecting the electric module to external connections are provided on at least one common side of the electric module.

15. The electric module according claim 1, wherein the at least two plate-shaped coolers each form an inner cooling surface that is in direct contact with the coolant and an outer cooling surface that is connected with the at least one electric circuit, and that the inner cooling surface is larger than the outer cooling surface.

16. The electric module according to claim 15, wherein the inner cooling surface is larger than the outer cooling surface by at least a factor of three.

17. The electric module according to claim 1, wherein the each of the at least two plate-shaped coolers has a cooling capacity of at least 25 $W/cm^2$, relative to an outer cooling surface actually occupied or covered by the at least one electric circuit or at least one substrate to be cooled.

18. The electric module according to claim 1, wherein the insulating layer of the substrate is a ceramic layer.

19. The electric module according to claim 1, wherein the insulating layer of the substrate is provided with the at least one-sided metallization on both surface sides.

20. The electric module according to claim 1, wherein the substrate is manufactured or bonded to the one of the at least two plate-shaped coolers using direct bonding technology.

21. The electric module according to claim 1, wherein the substrate is manufactured or bonded to the one of the at least two plate-shaped coolers using active soldering technology.

22. The electric module as claimed in claim 1, wherein the insulating layer of the substrate is provided with the at least one-sided metallization on both sides, and wherein the metallization on the substrate side facing the one of he two plate-shaped coolers is bonded to the one of the two plate-shaped coolers.

23. The electric module of claim 1, wherein the at least one-sided metallization on the substrate side facing the one of the two adjacent coolers is bonded to the one of the two plate-shaped coolers by a thermally conductive adhesive or by soldering or by direct bonding.

* * * * *

UNITED STATES PATENT AND TRADEMARK OFFICE
CERTIFICATE OF CORRECTION

| | | |
|---|---|---|
| PATENT NO. | : 7,940,526 B2 | Page 1 of 1 |
| APPLICATION NO. | : 11/992986 | |
| DATED | : May 10, 2011 | |
| INVENTOR(S) | : Schulz-Harder et al. | |

It is certified that error appears in the above-identified patent and that said Letters Patent is hereby corrected as shown below:

Column 8, line 10, cancel the text beginning with "22. The electric module" to and ending "shaped coolers." in column 8, line 15, and insert the following claim:

-- 22. The electric module as claimed in claim 1, wherein the insulating layer of the substrate is provided with the at least one-sided metallization on both sides, and wherein the metallization on the substrate side facing the one of the two plate-shaped coolers is bonded to the one of the two plate-shaped coolers. --

Signed and Sealed this
Fourteenth Day of June, 2011

David J. Kappos
*Director of the United States Patent and Trademark Office*